(12) United States Patent
Ikeda

(10) Patent No.: US 9,892,993 B2
(45) Date of Patent: Feb. 13, 2018

(54) SEMICONDUCTOR MODULE HAVING STACKED INSULATED SUBSTRATE STRUCTURES

(71) Applicant: Shindengen Electric Manufacturing CO., Ltd., Tokyo (JP)

(72) Inventor: Kosuke Ikeda, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/106,804

(22) PCT Filed: Apr. 28, 2015

(86) PCT No.: PCT/JP2015/002284
§ 371 (c)(1),
(2) Date: Jun. 20, 2016

(87) PCT Pub. No.: WO2016/174697
PCT Pub. Date: Nov. 3, 2016

(65) Prior Publication Data
US 2017/0133294 A1    May 11, 2017

(51) Int. Cl.
*H01L 23/36* (2006.01)
*H01L 23/29* (2006.01)
(Continued)

(52) U.S. Cl.
CPC ...... *H01L 23/3675* (2013.01); *H01L 21/4871* (2013.01); *H01L 21/563* (2013.01);
(Continued)

(58) Field of Classification Search
CPC . H01L 23/3675; H01L 23/29; H01L 23/3121; H01L 24/33; H01L 25/071; H01L 25/50
See application file for complete search history.

(56) References Cited

U.S. PATENT DOCUMENTS 6,084,771 A * 7/2000 Ranchy ............. H05K 7/20927
165/185
6,845,012 B2 * 1/2005 Ohkouchi ........... H01L 23/4006
257/675

(Continued)

FOREIGN PATENT DOCUMENTS

DE    112007001249    4/2009
JP    8-139223    5/1996

(Continued)

OTHER PUBLICATIONS

PCT International Written Opinion from PCT/JP2015/002284 dated Jul. 21, 2015, and machine English translation (Adobe OCR, Google Translate).

(Continued)

*Primary Examiner* — Ida M Soward
(74) *Attorney, Agent, or Firm* — Ladas & Parry, LLP

(57) ABSTRACT

A semiconductor module (100) has a first insulating substrate (11); a first conductor layer (12) provided on a mounting surface of the first insulating substrate (11); a first electronic element (13) provided on the first conductor layer (12); a sealing resin (80), which covers an overall mounting region within the mounting surface of the first insulating substrate (11), the first conductor layer (12), and the first electronic element (13); and a frame body (70), which is made of metal and covers the overall sealing resin (80).

8 Claims, 14 Drawing Sheets

(51) Int. Cl.
*H01L 23/31* (2006.01)
*H01L 25/07* (2006.01)
*H01L 23/367* (2006.01)
*H01L 23/00* (2006.01)
*H01L 25/00* (2006.01)
*H01L 21/56* (2006.01)
*H01L 21/48* (2006.01)

(52) U.S. Cl.
CPC .......... *H01L 23/29* (2013.01); *H01L 23/3121* (2013.01); *H01L 24/33* (2013.01); *H01L 25/071* (2013.01); *H01L 25/50* (2013.01)

(56) References Cited

U.S. PATENT DOCUMENTS

| | | | |
|---|---|---|---|
| 6,885,096 B2 * | 4/2005 | Hirahara | H01L 25/071 |
| | | | 257/666 |
| 7,242,582 B2 * | 7/2007 | Kurauchi | H01L 23/3107 |
| | | | 257/706 |
| 7,671,465 B2 * | 3/2010 | Funakoshi | H01L 23/3735 |
| | | | 257/706 |
| 8,957,517 B2 * | 2/2015 | Mamitsu | H01L 23/4334 |
| | | | 257/714 |
| 9,171,772 B2 * | 10/2015 | Shikano | H01L 23/367 |
| 9,305,910 B2 * | 4/2016 | Horio | H01L 23/5385 |
| 9,386,698 B2 * | 7/2016 | Ikeda | H05K 1/18 |
| 2004/0212970 A1 | 10/2004 | Chen et al. | |
| 2006/0054901 A1 | 3/2006 | Shoji et al. | |
| 2007/0273009 A1 | 11/2007 | Hauenstein | |
| 2009/0140402 A1 | 6/2009 | Ohtani | |
| 2010/0084665 A1 * | 4/2010 | Daniels | H01L 24/75 |
| | | | 257/88 |
| 2010/0238627 A1 * | 9/2010 | Shinohara | H01L 23/3107 |
| | | | 361/695 |
| 2011/0001225 A1 | 1/2011 | Ohtani | |
| 2012/0228757 A1 | 9/2012 | Kitami et al. | |
| 2013/0241043 A1 | 9/2013 | Kato et al. | |
| 2014/0124936 A1 | 5/2014 | Yanagawa et al. | |
| 2014/0319669 A1 | 10/2014 | Kimijima et al. | |
| 2016/0027711 A1 * | 1/2016 | Harada | H01L 25/07 |
| | | | 257/698 |
| 2016/0181175 A1 * | 6/2016 | Ikeda | H01L 23/42 |
| | | | 257/687 |
| 2016/0329272 A1 * | 11/2016 | Geissler | H01L 24/13 |

FOREIGN PATENT DOCUMENTS

| | | | | |
|---|---|---|---|---|
| JP | 2004-327555 | | 11/2004 | |
| JP | 2006-202899 | | 8/2006 | |
| JP | 2007273982 | A * | 10/2007 | |
| JP | 2008-103552 | | 5/2008 | |
| JP | 2009-140962 | | 6/2009 | |
| JP | 2009-538534 | | 11/2009 | |
| JP | 2010140969 | A * | 6/2010 | ............ H01L 24/33 |
| JP | 2011-114176 | | 9/2011 | |
| JP | 2013-171852 | | 9/2013 | |
| JP | 2014-45157 | | 3/2014 | |
| JP | 2015-76488 | | 4/2015 | |
| TW | 200423349 | | 11/2004 | |
| WO | 2007139852 | | 12/2007 | |
| WO | 2014184846 A1 | | 11/2014 | |
| WO | 2015052880 | | 4/2015 | |

OTHER PUBLICATIONS

English translation from WIPO for PCT International Search Report from PCT/JP2015/002284 dated Jul. 21, 2015.
PCT International Preliminary Report on Patentability (Chapter II) from PCT/JP2015/002284 dated Jan. 28, 2016, and its machine English translation (Adobe OCR, Google Translate).
International Search Report dated Apr. 28, 2015 for PCT/JP2015/002284.
International Preliminary Examination Report dated Apr. 28, 2015 for PCT/JP2015/002284.
Supplementary European Search Report and Opinion for European Patent application No. EP 15860021.3 dated Oct. 4, 2017.

* cited by examiner

SEMICONDUCTOR MODULE HAVING STACKED INSULATED SUBSTRATE STRUCTURES

CROSS-REFERENCE TO RELATED APPLICATION(S)

This application is the U.S. National Stage of International Patent Application No. PCT/JP2015/002284 filed on Apr. 28, 2015, the disclosure of which is incorporated in its entirety herein by reference.

TECHNICAL FIELD

The present invention relates to a semiconductor module and a method for manufacturing the semiconductor module.

BACKGROUND ART

A semiconductor module including an electronic element formed with a chip, or the like, and sealing resin for sealing the electronic element is conventionally known. An exemplary conventional semiconductor module like this is described in JP 2011-114176A. JP 2011-114176A discloses a power semiconductor apparatus equipped with a power semiconductor element, a pair of first metal members arranged so as to sandwich the power semiconductor element, a pair of insulating layers stacked on a pair of heat dissipation plate so as to sandwich the pair of first metal members, and filling resin that is filled so as to cover: a first power semiconductor element; the pair of first metal members; and the pair of insulating layers.

When an overcurrent has passed through the conventional semiconductor module, the electronic element formed with a chip, or the like might be broken, wiring connected to the electronic element might be fused, and sealing resin covering devices might be carbonized before the wiring is fused, in some cases. In a case where the sealing resin is carbonized, a failure attributed to heat of the carbonized sealing resin might occur.

In order to prevent occurrence of the failure, there is discussion of using flame-retardant resin as the sealing resin. Unfortunately, however, even when the electronic element fails, the overcurrent continues to pass through the electronic element depending on a circuit system. In this case, all the sealing resin might be carbonized even when it is flame retardant, leading to possible occurrence of a failure attributed to the heat of the carbonized sealing resin.

SUMMARY OF INVENTION

Technical Problem

The present invention is made in view of these points and intended to provide a semiconductor module and a method for manufacturing the semiconductor module, capable of preventing occurrence of a failure attributed to the heat of carbonized sealing resin even when an overcurrent has passed through the electronic element and the sealing resin has been carbonized.

Solution to Problem

A semiconductor module according to the present invention comprises:
a first insulating substrate;
a first conductor layer provided on a mounting surface of the first insulating substrate;
a first electronic element provided on the first conductor layer;
a sealing resin, which covers an overall mounting region within the mounting surface of the first insulating substrate, the first conductor layer, and the first electronic element; and
a frame body, which is made of metal and covers the overall sealing resin.

In the semiconductor module according to the present invention,
the first conductor layer and the frame body may be joined with each other.

The semiconductor module, according to the present invention, may further comprise:
a second insulating substrate;
a second conductor layer provided on amounting surface of the second insulating substrate; and
a second electronic element provided on the second conductor layer,
wherein the first conductor layer, the first electronic element, the second electronic element and the second conductor layer may be arranged in an order between the first insulating substrate and the second insulating substrate.

The semiconductor module, according to the present invention, may further comprise:
a conductive column, which connects the first electronic element with the second electronic element.

In the semiconductor module according to the present invention,
wherein each of the first electronic element and the second electronic element may be a power device.

The semiconductor module, according to the present invention, may further comprise:
an outer resin, which is provided outside of the frame body and is made of a material with flame retardance compared with the sealing resin.

An electronic instrument according to the present invention comprises:
the aforementioned semiconductor module; and
a heat sink having a recess, into which the semiconductor module is inserted.

In the electronic instrument according to the present invention,
lubricant may be applied between the recess of the heat sink and the semiconductor module.

The electronic instrument according to the present invention may further comprise:
a closing section, which covers the semiconductor module inserted into the recess of the heat sink.

A method for manufacturing a semiconductor module according to the present invention comprises:
covering, among a first insulating substrate, a first conductor layer provided on a mounting surface of the first insulating substrate and a first electronic element provided on the first conductor layer, an overall mounting region, the first conductor layer and the first electronic element with a frame body made of metal; and
injecting a sealing resin material into the frame body, as a result, the overall mounting region, the first conductor layer and the first electronic element are covered by a sealing resin.

A method for manufacturing a semiconductor module according to the present invention may further comprise:
setting the frame body inside a metal mold, before injecting the sealing resin material into the frame body;
removing a part of the metal mold, after injecting the sealing resin material into the frame body; and
injecting an outer resin material into the metal mold after removing the part of the metal mold, as a result, an outer resin, which is made of a material with flame retardance compared with the sealing resin, is provided outside of the frame body.

Advantageous Effects of Invention

In the present invention, the overall sealing resin is covered with the metal frame body. Accordingly, in a case an overcurrent is passed through the first electronic element, and then the sealing resin is carbonized, it is possible to prevent occurrence of a failure attributed to the heat of the carbonized sealing resin. By employing the metal frame body, it is possible to achieve high thermal dissipation, and to suppress influence of a high-frequency noise from the outside of the frame body or influence of a high-frequency noise generating from the inside of the frame body.

DESCRIPTION OF EMBODIMENTS

First Embodiment

<<Configuration>>

Hereinafter, a semiconductor module and a method for manufacturing the semiconductor module according to a first embodiment of the present invention will be described with reference to the drawings.

Figure 1:
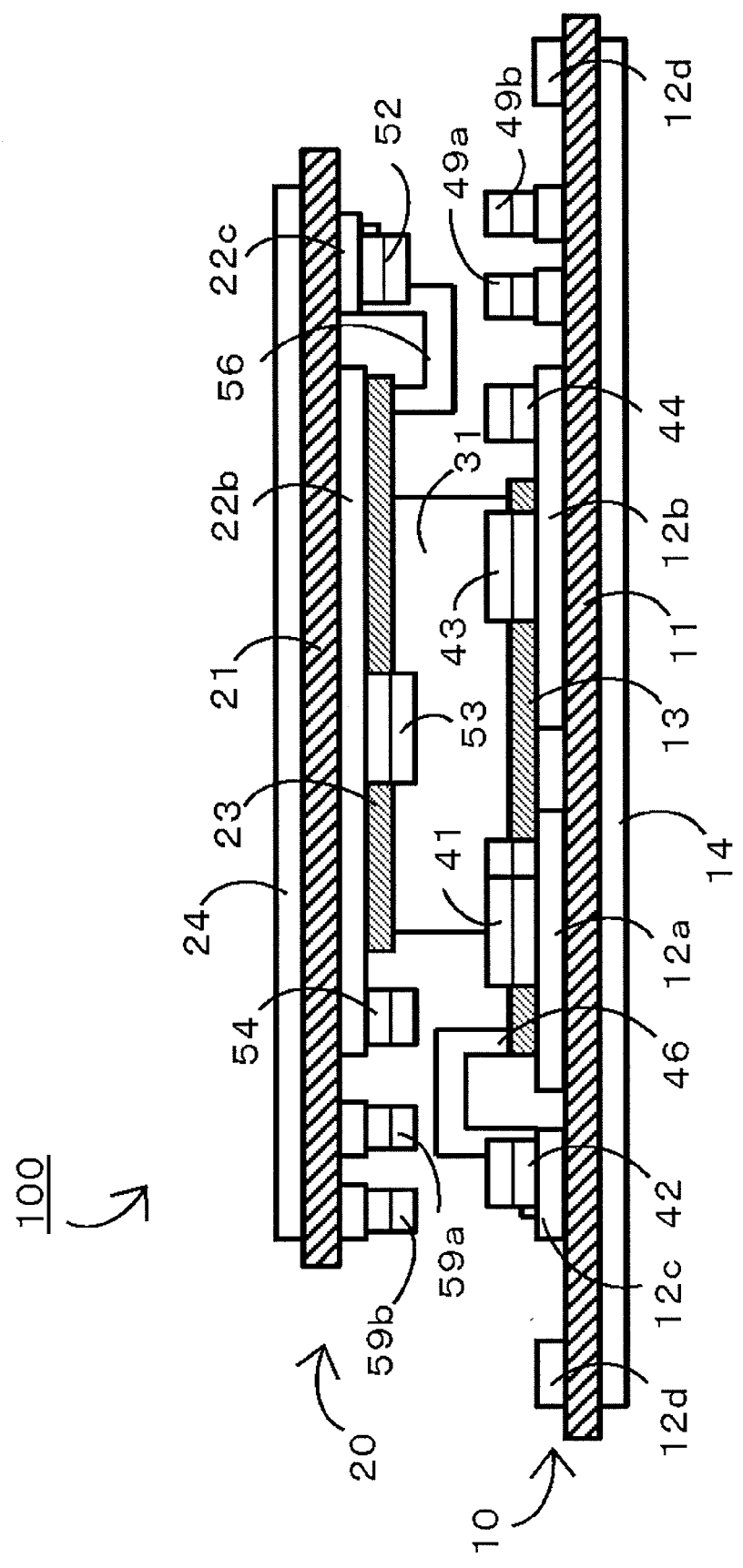
FIG. 1 is a front sectional view of a semiconductor module according to a first embodiment of the present invention.

As illustrated in FIG. 1, a semiconductor module 100 according to the present embodiment includes a first member 10, a second member 20, and a conductive column 31 extending in an up-down direction between the first member 10 and the second member 20.

Figure 2:
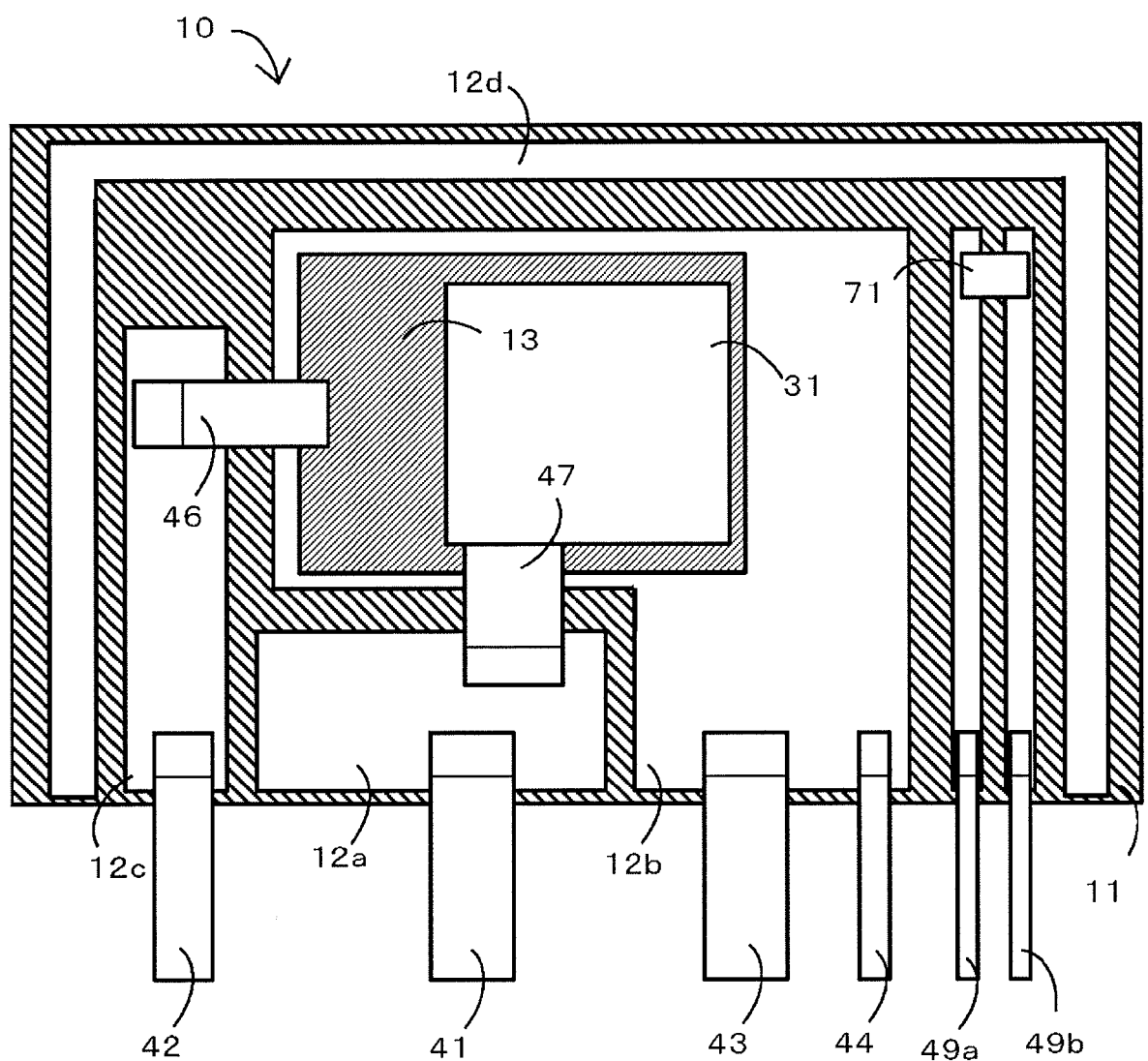
FIG. 2 is a plan view of a first member and a conductive column used in the first embodiment of the present invention.
Figure 4:
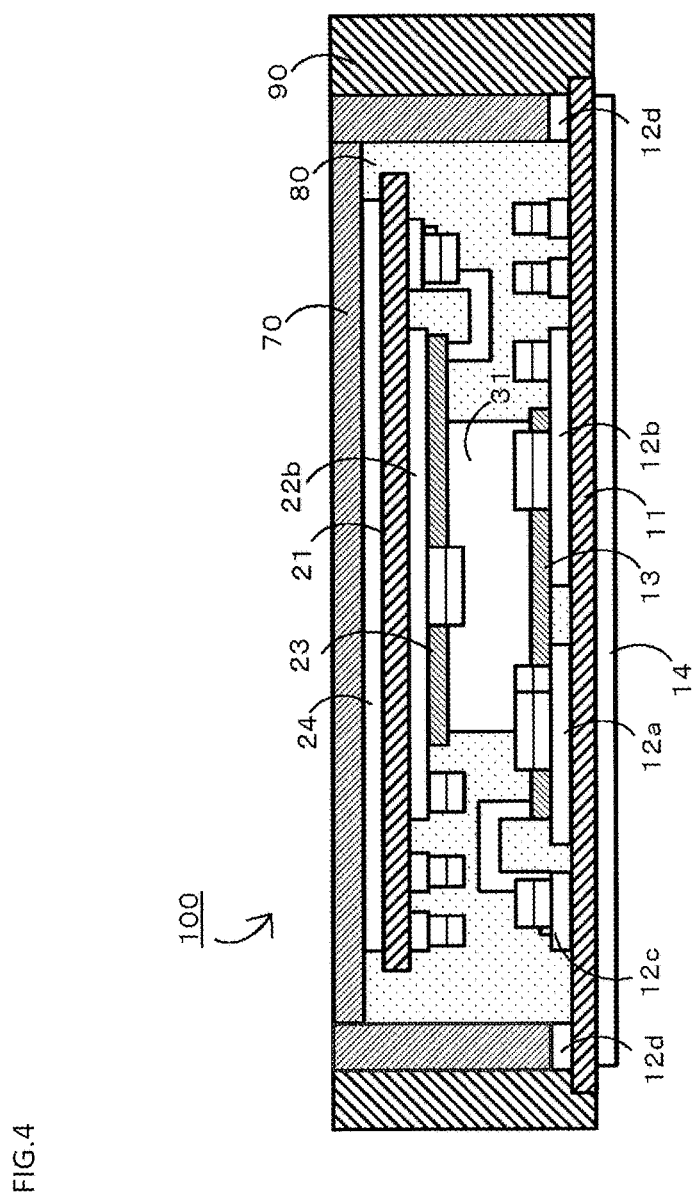
FIG. 4 is a sectional front view of the semiconductor module according to the first embodiment of the present invention, with illustrations of sealing resin, a frame body, and outer resin.

As illustrated in FIG. 2, the first member 10 includes a first insulating substrate 11, a first conductor layer 12 (12a to 12d) provided on a mounting surface of the first insulating substrate 11, and a first electronic element 13 provided on a first conductor layer portion 12b (described below) of the first conductor layer 12. As illustrated in FIG. 4, the semiconductor module 100 according to the present embodiment includes sealing resin 80 and a frame body 70. The sealing resin 80 is configured to cover an overall mounting region within the mounting surface of the first insulating substrate 11, the first conductor layer 12, and the first electronic element 13. The frame body 70 is made of metal and configured to cover the overall sealing resin 80.

In the present embodiment, the mounting surface represents a surface on which an electronic element is mounted. In FIG. 4, an upper surface of the first insulating substrate 11 is the mounting surface, and a lower surface of a second insulating substrate 21 described below is the mounting surface. The mounting region represents a region in which an electronic element is mounted. The mounting region of the first insulating substrate 11 represents a region in which the first electronic element 13 is mounted. The mounting region of the second insulating substrate 21 described below represents a region in which a second electronic element 23 described below is mounted.

As illustrated in FIG. 1, in the present embodiment, the first insulating substrate 11 of the first member 10 and the second insulating substrate 21 of the second member 20 are arranged in parallel with each other. In the present embodiment, a direction that is orthogonal to a surface on which the first insulating substrate 11 and the second insulating substrate 21 extend (namely, up-down direction in FIG. 1) is referred to as an up-down direction.

The present embodiment describes an aspect in which one first electronic element 13 and one second electronic element 23 are provided. Alternatively, in an aspect in which the plurality of first electronic elements 13 is provided, each of regions in which each of the first electronic elements 13 is provided is the mounting region. Accordingly, covering an overall mounting region means covering all regions in which each of the first electronic elements 13 is provided. Similarly, in an aspect in which the plurality of second electronic elements 23 is provided, each of regions in which each of the second electronic elements 23 is provided is to be the mounting region. Accordingly, covering an overall mounting region means covering all regions in which each of the second electronic elements 23 is provided.

Although a material of the metal frame body 70 is not limited in particular, examples of the material include aluminum, iron, stainless steel, and copper. When comprehensively considering lightweight, workability, price, or the like, it is desirable to use aluminum as the material. The metal frame body 70 need not be made of metallic elements only but may be made of metal oxide, or the like.

As illustrated in FIG. 2, in the present embodiment, an attaching conductor layer 12d is provided on the first insulating substrate 11, for attaching the frame body 70. The attaching conductor layer 12d is arranged along a periphery of the first insulating substrate 11 and has a substantially "⊐"-shaped form when viewed from above. The frame body 70 is mounted on the attaching conductor layer 12d (refer to FIG. 4). The attaching conductor layer 12d and the frame body 70 are joined with each other with solder, for example. In the present embodiment, a region at an inner side of the attaching conductor layer 12d is a mounting region. A plurality of first conductor layer portions 12a to 12c is provided in the mounting region.

Figure 3:
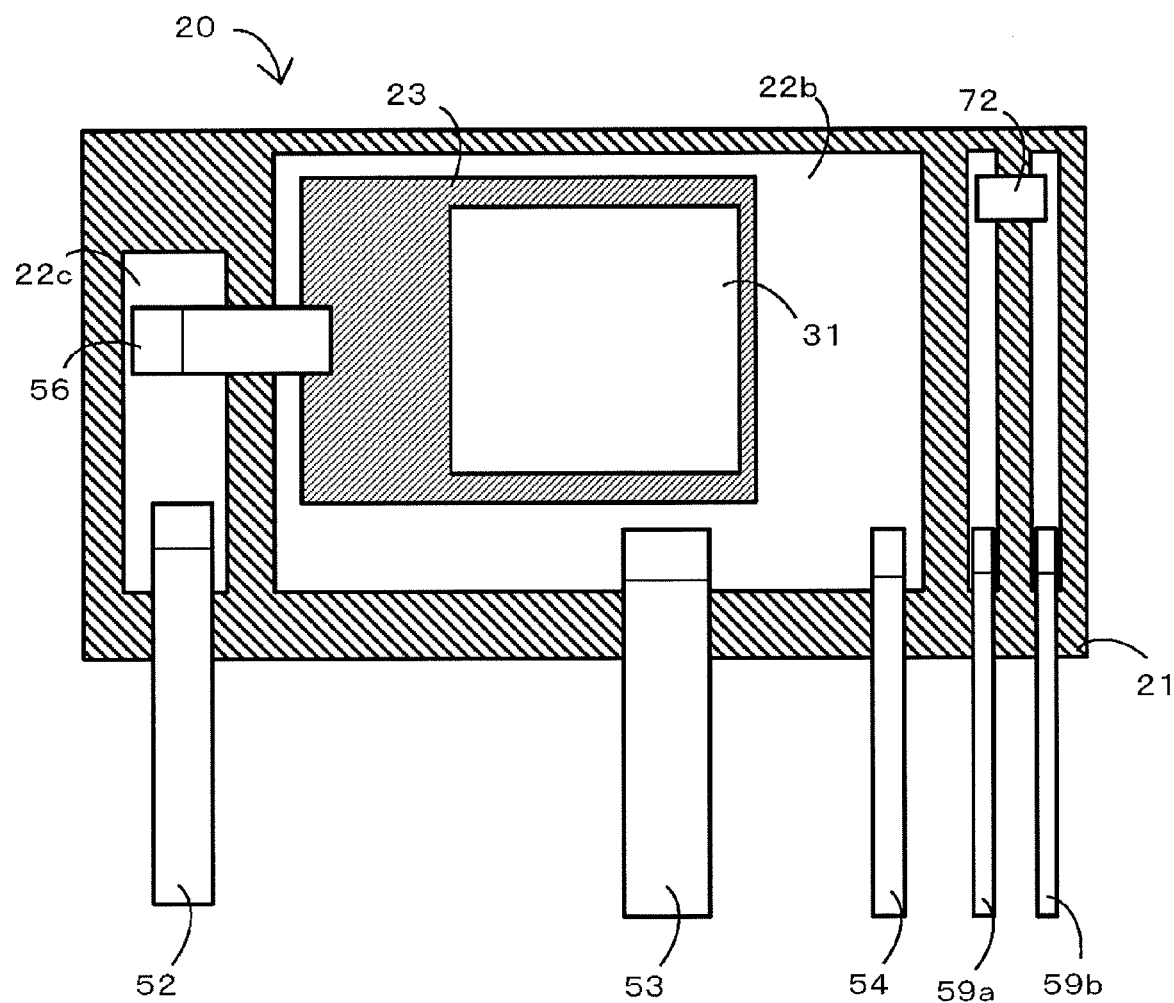
FIG. 3 is a plan view of a second member and the conductive column used in the first embodiment of the present invention.

As illustrated in FIG. 3, the second member 20 includes a second insulating substrate 21, a second conductor layer 22 (22b and 22c) provided on a mounting surface of the second insulating substrate 21, and a second electronic element 23 provided on a second conductor layer portion 22b (described below) of the second conductor layer 22.

In an aspect illustrated in FIG. 1, in an order from a bottom, arranged are the first insulating substrate 11, the first conductor layer 12, the first electronic element 13, the second electronic element 23, the second conductor layer 22, and the second insulating substrate 21.

As illustrated in FIG. 2, the first conductor layer 12 includes a plurality of first conductor layer portions 12a to 12d provided on the mounting surface of the first insulating substrate 11. As illustrated in FIG. 3, the second conductor layer 22 includes a plurality of second conductor layer portions 22b and 22c provided on the mounting surface of the second insulating substrate 21.

The semiconductor module 100 in the present embodiment includes the conductive column 31 connecting the first electronic element 13 with the second electronic element 23. The conductive column 31 has a substantially rectangular cross section (refer to FIGS. 2 and 3), extending in the up-down direction as illustrated in FIG. 1. As illustrated in FIG. 1, a lower surface of the conductive column 31 is connected to an upper surface of the first electronic element 13. A lower surface of the second electronic element 23 is connected to an upper surface of the conductive column 31.

In the present embodiment, a first connecting unit 46 is connected to a portion substantially at a center of a left side on the upper surface of the first electronic element 13 in FIG. 2. In addition, a second connecting unit 56 is connected to a portion substantially at a center of a left side on an upper surface of the second electronic element 23 in FIG. 3.

In the present embodiment, the second member 20 is flipped and stacked over the first member 10. Accordingly, in an aspect illustrated in FIG. 1, the first connecting unit 46 is connected to the left side on the upper surface of the first electronic element 13, while the second connecting unit 56 is connected to a right side of a lower surface on the second electronic element 23.

Figure 5:
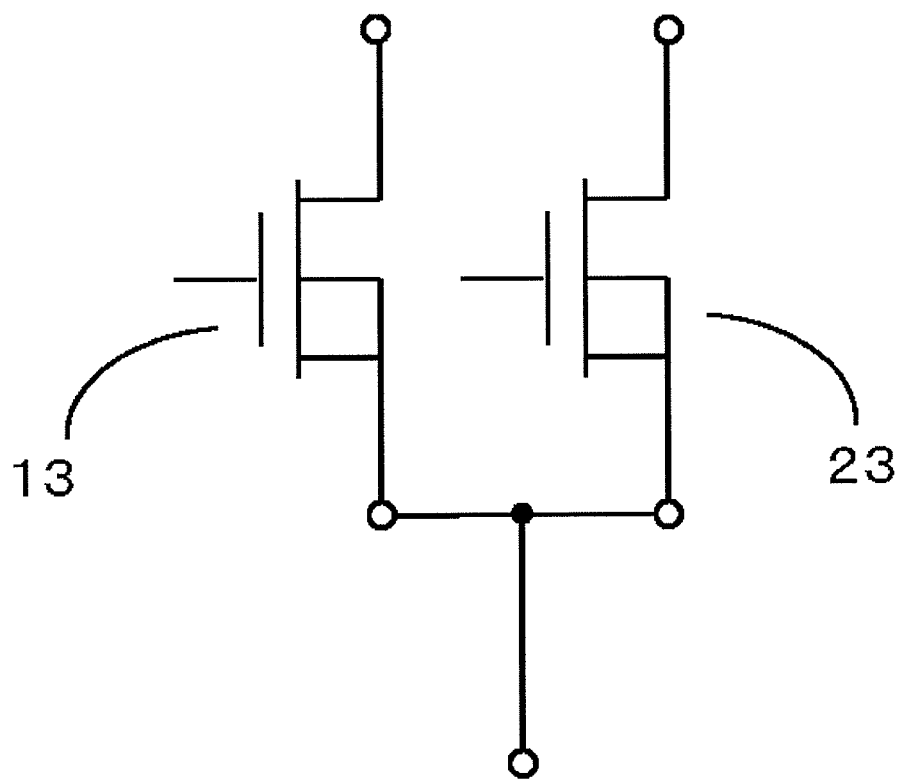
FIG. 5 is a circuit diagram of the semiconductor module according to the first embodiment of the present invention.

Each of the first electronic element 13 and the second electronic element 23, according to the present embodiment, is a switching device, for example. As illustrated in FIG. 2, a column connecting unit 47 connected to the first conductor layer portion 12a is provided on a side surface of the conductive column 31. The first conductor layer portion 12a is provided with a lead frame 41 configured to be connected to a source electrode. Power supplied from the source electrode is supplied to the first electronic element 13 and the second electronic element 23 via the first conductor layer portion 12a, the column connecting unit 47, and the conductive column 31 (also refer to FIG. 5). Power being supplied like this becomes one of reasons for higher temperature on the upper surface, in FIG. 1, of the first electronic element 13 connected to the conductive column 31, compared with a lower surface, and for higher temperature on a lower surface, in FIG. 1, of the second electronic element 23, compared with an upper surface.

As illustrated in FIG. 1, the first connecting unit 46 is substantially "⊐"-shaped when viewed from the front. As illustrated in FIG. 1, the second connecting unit 56 is also substantially "⊐"-shaped when viewed from the front. As illustrated in FIG. 2, the first connecting unit 46 is connected with the first conductor layer portion 12c. The first conductor layer portion 12c is provided with a lead frame 42 configured to be connected to a control electrode such as a gate electrode. As illustrated in FIG. 3, the second connecting unit 56 is connected with the second conductor layer portions 22c. The second conductor layer portion 22c is provided with a lead frame 52 configured to be connected to a control electrode such as a gate electrode.

In FIG. 2, the first conductor layer portion 12b provided on the lower surface of the first electronic element 13 is connected to a lead frame 43 configured to be connected to a drain electrode. In FIG. 3, the second conductor layer portion 22b provided on a lower surface of the second electronic element 23 is connected to a lead frame 53 configured to be connected to a drain electrode.

In the present embodiment, a first heat dissipation plate 14 made of copper, or the like, is provided on an opposite side (lower surface side in FIG. 1) of the mounting surface of the first insulating substrate 11. A second heat dissipation plate 24 made of copper, or the like, is provided on an opposite side (upper surface side in FIG. 1) of the mounting surface of the second insulating substrate 21.

Each of the first electronic element 13 and the second electronic element 23 of the present invention may be a power device. An example of the power device is a switching device described above. More specifically, examples of electronic elements include FET such as MOSFET, a bipolar transistor, and IGBT. Among these, a typical example would be the MOSFET.

As illustrated in FIG. 4, in the present embodiment, outer resin 90 is provided outside of the frame body 70. More specifically, the outer resin 90 is provided so as to cover an overall side surface of the frame body 70 (refer to FIG. 7B). The outer resin 90 can be arranged so as to cover upper/lower surfaces of the frame body 70. In the present embodiment, however, in view of thermal dissipation, the outer resin 90 is not provided on the upper/lower surfaces of the frame body 70.

The outer resin 90 may be made of a material with flame retardance compared with the sealing resin 80. Flame-retardant resin includes resin having itself flame retardance, namely, having high decomposition temperature and generating few flammable matters when the resin is discomposed, and resin having high limiting oxygen index. Examples of flame-retardant resin include fluorine resin, polyimide resin, polyamideimide resin, polyether sulphone resin, polyether ether ketone resin, polyether imide resin, polyphenylene sulfide resin, and liquid crystal polymer.

The sealing resin 80 is not particularly limited as long as it is insulating resin, namely, the resin having insulation performance. Examples of the sealing resin 80 applicable include epoxy resin and epoxy resin composition having curing agent, curing accelerator, inorganic filler, or the like. The epoxy resin composition is not particularly limited as long as it has two or more epoxy groups in one molecule.

Figure 6:
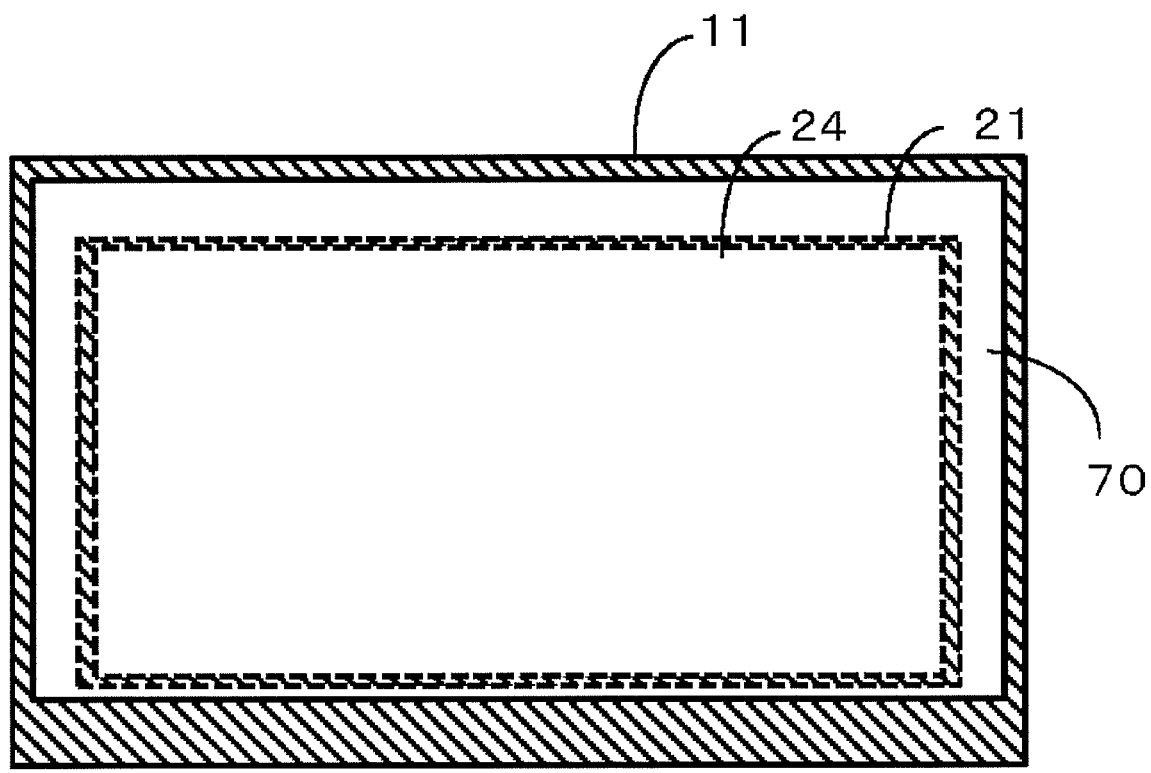
FIG. 6 is top plan view for illustrating a size and a positional relationship between a first insulating substrate, second insulating substrate, and a frame body, used in the first embodiment of the present invention.

As illustrated in FIG. 6, in the present embodiment, the size of the first insulating substrate 11 in a surface direction is larger than the size of the second insulating substrate 21 in the surface direction. More specifically, when viewed from above, the first insulating substrate 11 is arranged on the outside of each of sides of the second insulating substrate 21 in the present aspect. The frame body 70 is arranged to enclose the second heat dissipation plate 24 and the second insulating substrate 21, and to cover the overall mounting surface of the first insulating substrate 11 (refer to FIG. 4). FIG. 6 illustrates only the first insulating substrate 11, the second insulating substrate 21, the second heat dissipation plate 24, and the frame body 70. The second insulating substrate 21 and the second heat dissipation plate 24, which are arranged inside the frame body 70 and are not actually visible, are indicated by a broken line.

As illustrated in FIG. 4, in the present embodiment, the frame body 70 covers an overall mounting region of the first insulating substrate 11, the first conductor layer 12 besides the attaching conductor layer 12d, the first electronic element 13, the conductive column 31, the second electronic element 23, the second conductor layer 22, the second insulating substrate 21, the second heat dissipation plate 24, and the sealing resin 80. Meanwhile, an upper surface of the second heat dissipation plate 24 is abutted against an inner peripheral surface (lower surface in FIG. 4) of the frame body 70, allowing heat to be transmitted from the second heat dissipation plate 24 to the frame body 70.

In the present embodiment, the overall second member 20 is covered with the frame body 70. Accordingly, the overall mounting region of the second insulating substrate 21 is inevitably covered with the frame body 70.

The semiconductor module 100 according to the present embodiment includes the above-described lead frames, namely, the lead frames 42 and 52 configured to be connected to two gate electrodes, the lead frame 41 configured to be connected to one source electrode, the lead frames 43 and 53 configured to be connected to two drain electrodes, and also includes a plurality of lead frames including 44, 49a, 49b, 54, 59a, and 59b, to be described below. Each of the lead frames protrudes from a side of the sealing resin 80 to the outside. As illustrated in FIGS. 2 and 3, each of the lead frames protrudes downwardly from a side extending in a left-right direction at a lower side in FIGS. 2 and 3.

As illustrated in FIG. 2, the semiconductor module 100 includes a first heat detecting resistor 71 on a first insulating substrate 11 side. The two lead frames 49a and 49b are connected to the first heat detecting resistor 71. The first heat detecting resistor 71 is arranged in the neighborhood of the first conductor layer portion 12b configured to be connected to the drain electrode, and is used to measure a temperature of the first conductor layer portion 12b. As illustrated in FIG. 3, the semiconductor module 100 includes a second heat detecting resistor 72 on a second insulating substrate 21 side. The two lead frames 59a and 59b are connected to the second heat detecting resistor 72. The second heat detecting resistor 72 is arranged in the neighborhood of the second conductor layer portion 22b configured to be connected to the drain electrode, and used to measure a temperature of the second conductor layer portion 22b.

As illustrated in FIG. 2, the first conductor layer portion 12b configured to be connected to the drain electrode is provided with the lead frame 44 for sensing. As illustrated in FIG. 3, the second conductor layer portion 22b configured to be connected to the drain electrode is provided with the lead frame 54 for sensing.

<<Manufacturing Method>>

The semiconductor module 100 according to the present embodiment is manufactured in the following exemplary manner.

The first member 10 is prepared. On this first member, the first conductor layer 12 has been provided on a mounting surface of the first insulating substrate 11, the first electronic element 13 has been provided on the first conductor layer portion 12b of the first conductor layer 12, and the first heat dissipation plate 14 has been provided on a surface on the opposite side of the mounting surface of the first insulating substrate 11 (refer to FIG. 1). The second member 20 is prepared. On this second member, the second conductor layer 22 has been provided on a mounting surface of the second insulating substrate 21, the second electronic element 23 has been provided on the second conductor layer portion 22b of the second conductor layer 22, and the second heat dissipation plate 24 has been provided on a surface on the opposite side of the mounting surface of the second insulating substrate 21. The second member 20 is flipped by 180 degrees and positioned such that the second electronic element 23 faces downward. Subsequently, the conductive column 31 is positioned between the first electronic element 13 of the first member 10, and the second electronic element 23 of the second member 20. The first electronic element 13 and the second electronic element 23 are connected with each other via the conductive column 31.

Next, the frame body 70 is arranged to enclose the second heat dissipation plate 24 and the second insulating substrate 21, and to cover the overall mounting surface of the first insulating substrate 11 (refer to FIG. 4). At this time, the attaching conductor layer 12d and the frame body 70 are attached with each other with solder, for example. As a result, the frame body 70 covers the overall mounting region of the first insulating substrate 11, the first conductor layer 12 besides the attaching conductor layer 12d, the first electronic element 13, the conductive column 31, the second electronic element 23, the second conductor layer 22, the second insulating substrate 21, and the second heat dissipation plate 24. A member manufactured in this manner will be referred to as an "intermediate member 190" in this description.

Figure 7A:
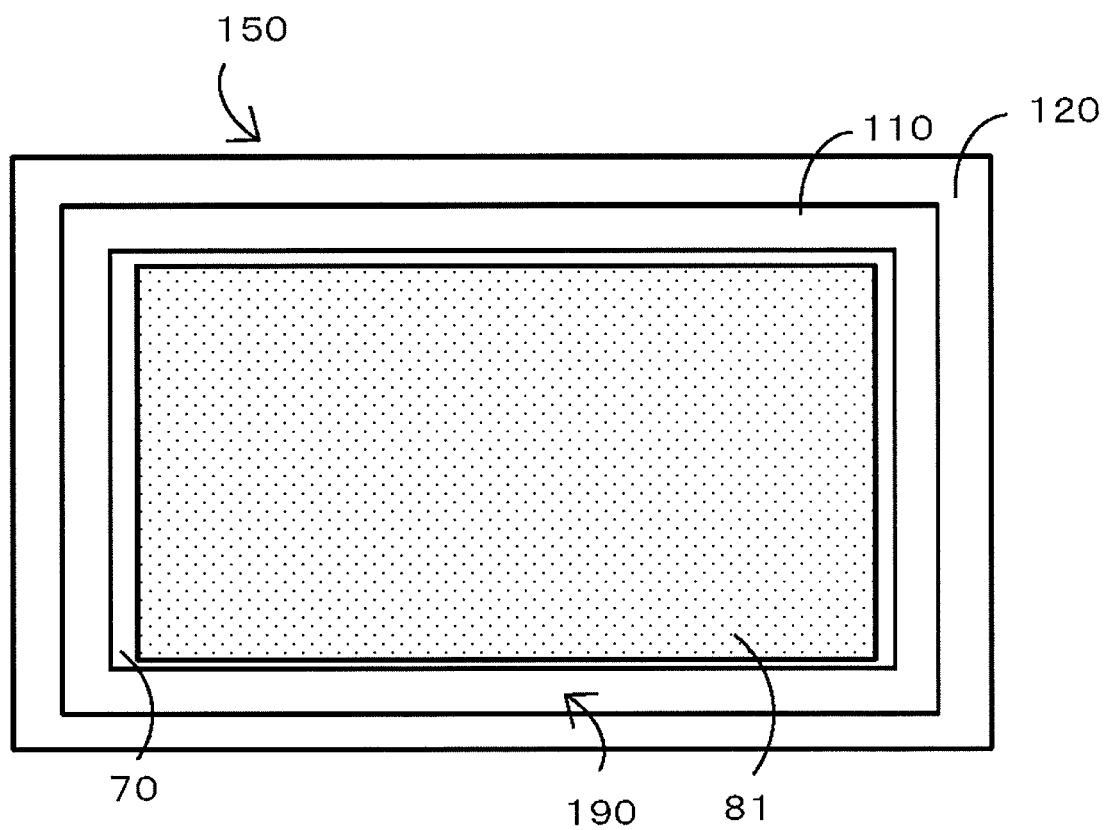
FIG. 7A is a sectional plan view for illustrating a method for manufacturing the semiconductor module according to the first embodiment of the present invention.

Next, the intermediate member 190 is mounted inside a metal mold 150 (refer to FIG. 7A). The metal mold 150 can be partially removed. Specifically, the metal mold 150 includes a first metal mold portion 110 and a second metal mold portion 120 enclosing an overall surface on the side portion of the first metal mold portion 110. The first metal mold portion 110 can be removed from the second metal mold portion 120. The size of an inner peripheral surface of the first metal mold portion 110 corresponds to the size of an outer peripheral surface of a side of the frame body 70. Accordingly, by fitting the frame body 70 into the first metal mold portion 110, it is possible to fix the frame body 70 onto the first metal mold portion 110.

Next, a sealing resin material 81 (material of the sealing resin 80) is injected into portions inside the frame body 70 from the upper direction in FIG. 7A, for example. By injecting the sealing resin material 81, the portions inside the frame body 70 are filled with the sealing resin material 81, as illustrated in FIG. 7A. As a result, the sealing resin material 81 covers the overall mounting region of the first insulating substrate 11, the first conductor layer 12 besides the attaching conductor layer 12d, the first electronic element 13, the conductive column 31, the second electronic element 23, the second conductor layer 22, the second insulating substrate 21, and the second heat dissipation plate 24. Since the upper surface of the second heat dissipation plate 24 is abutted against the inner peripheral surface of the frame body 70 (lower surface in FIG. 4), only side surfaces of the second heat dissipation plate 24 would be covered with the sealing resin material 81 (refer to FIG. 4). Note that FIG. 7A indicates only the materials needed for describing the metal mold 150, the intermediate member 190 including the frame body 70, the sealing resin material 81, or the like.

Figure 7B:
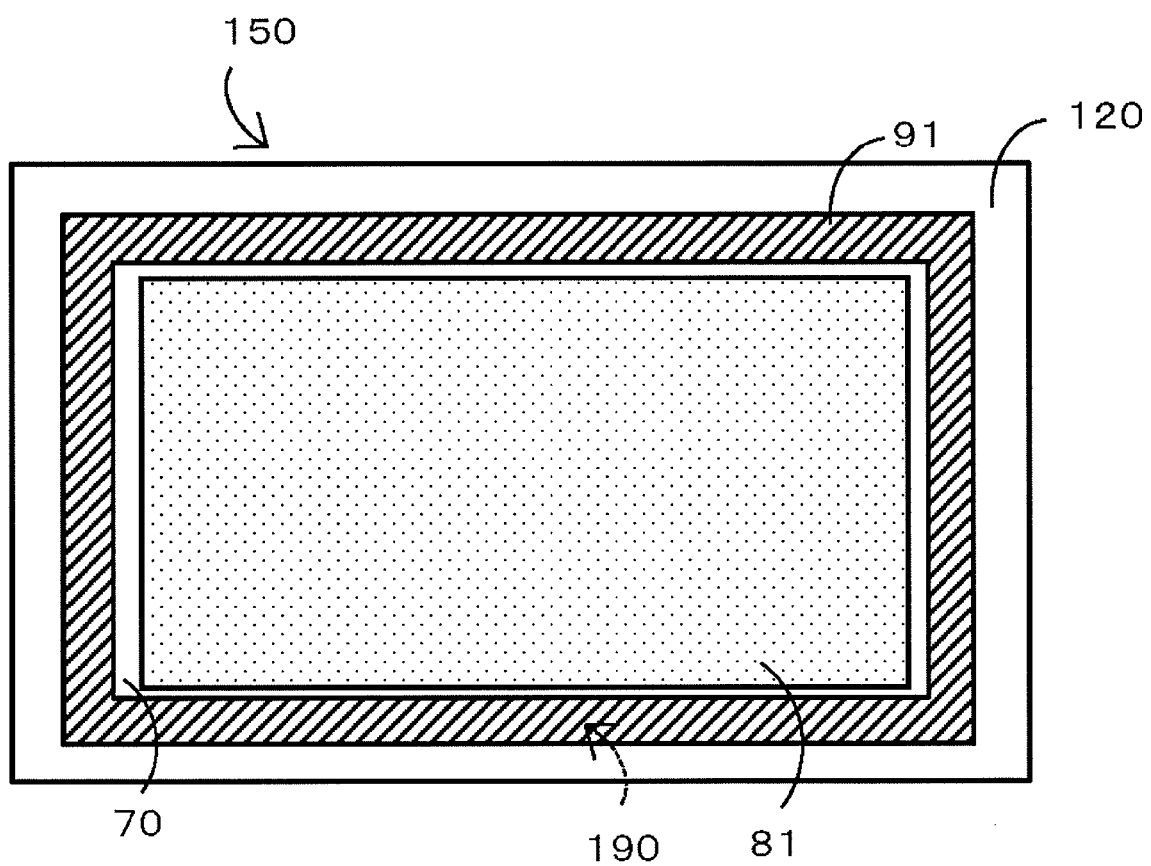
FIG. 7B is a diagram for illustrating a method for manufacturing the semiconductor module according to the first embodiment of the present invention, in a form of sectional plan view for illustrating a step advanced from FIG. 7A.

Next, the first metal mold portion 110 is removed from the second metal mold portion 120 (refer to FIG. 7B). In the present embodiment, the first metal mold portion 110 positioned on each of sides on the side portion of the intermediate member 190 is removed.

Next, an outer resin material 91 (material of the outer resin 90) is injected into the metal mold 150 (refer to in FIG. 7B). By injecting the outer resin material 91, a side portion on each of sides of the intermediate member 190 is covered with the outer resin material 91.

Each of the sealing resin material 81 and the outer resin material 91 is cured and respectively formed into the sealing resin 80 and the outer resin 90. The sealing resin material 81 and the outer resin material 91 may be simultaneously cured in this manner or may be cured with different timings. For example, the sealing resin material 81 may be cured before the first metal mold portion 110 is removed from the second metal mold portion 120.

As described above, the semiconductor module 100 according to the present embodiment is manufactured.

<<Actions and Effects>>

Next, actions and effects generated in the present embodiment with the above-described configuration will be described.

In the present embodiment, the overall sealing resin 80 is covered with the metal frame body 70. Accordingly, in a case an overcurrent is passed through the first electronic element 13 or the second electronic element 23, and then the sealing resin 80 is carbonized, it is possible to prevent occurrence of a failure attributed to the heat of the carbonized sealing resin 80. More specifically, even when the sealing resin 80 is carbonized and its temperature becomes high, it is possible to prevent the sealing resin 80 carbonized with high temperature from being exposed to the open air, or the like, making it possible to prevent occurrence of a failure attributed to the heat of the sealing resin 80. In the present embodiment, the overall mounting region of the first insulating substrate 11 is covered with the frame body 70. Accordingly, even when the plurality of first electronic elements 13 is mounted, it would be possible to prevent the heat attributed to each of the first electronic elements 13 from spreading to the outside of the frame body 70.

By employing the metal frame body 70, it is possible to achieve high thermal dissipation, and to suppress influence of a high-frequency noise from the outside of the frame body 70 or influence of a high-frequency noise generating from the inside of the frame body 70.

Even in cases where the plurality of first electronic elements 13 and/or the plurality of second electronic elements 23 is mounted, overall mounting regions corresponding to the first electronic elements 13 and the second electronic elements 23 would be covered with the sealing resin 80, and the overall sealing resin 80 would be covered with the frame body 70. Accordingly, even when the sealing resin 80 is carbonized as a result of the overcurrent passing through any of the electronic elements 13 and 23, it is possible to prevent occurrence of a failure attributed to the heat of the carbonized sealing resin 80.

In a case where each of the first electronic element 13 and the second electronic element 23 in the present embodiment is a power device, the devices with high heat generation property are arranged to face each other. Accordingly, it is highly demanded to reduce a risk due to the heat generated from the first electronic element 13 or the second electronic element 23. In this regard, according to the present embodiment, the overall sealing resin 80 is covered with the frame body 70, and therefore, even when the sealing resin 80 is carbonized because of heat generation from the first electronic element 13 or the second electronic element 23, it would be possible to prevent occurrence of a failure attributed to the heat of the carbonized sealing resin 80.

In the present embodiment, in a case where an aspect in which the outer resin 90 is provided outside of the frame body 70 is employed, it is possible to absorb an impact toward the frame body 70 and consequently absorb impacts toward the first electronic element 13 and the second electronic element 23. In the present embodiment, although the outer resin 90 is provided so as to cover the overall side surface of the frame body 70, the upper surface of the frame body 70 (hereinafter, referred to as a "heat dissipation surface of the frame body 70") and the first heat dissipation plate 14 are not covered with the outer resin 90. Accordingly, it is possible to dissipate the heat generated inside the frame body 70, from both the heat dissipation surface of the frame body 70 and the first heat dissipation plate 14.

In a case where the outer resin 90 is made of a material with flame retardance, it is possible to further reduce the risk due to the heat generated from the first electronic element 13 or the second electronic element 23. As described above, in the present embodiment, the frame body 70 covers the overall sealing resin 80. By using a material with flame retardance as the outer resin 90 arranged so as to enclose the frame body 70, it is possible to prevent more reliably the occurrence of a failure attributed to the heat of the carbonized sealing resin 80. Since the outer resin 90 is flame retardant compared with the sealing resin 80, even in a case where the sealing resin 80 is carbonized, it is highly likely that the heat that has reached the outer resin 90 via the frame body 70 would not carbonize the outer resin 90.

Second Embodiment

Next, a second embodiment of the present invention will be described.

Figure 8:
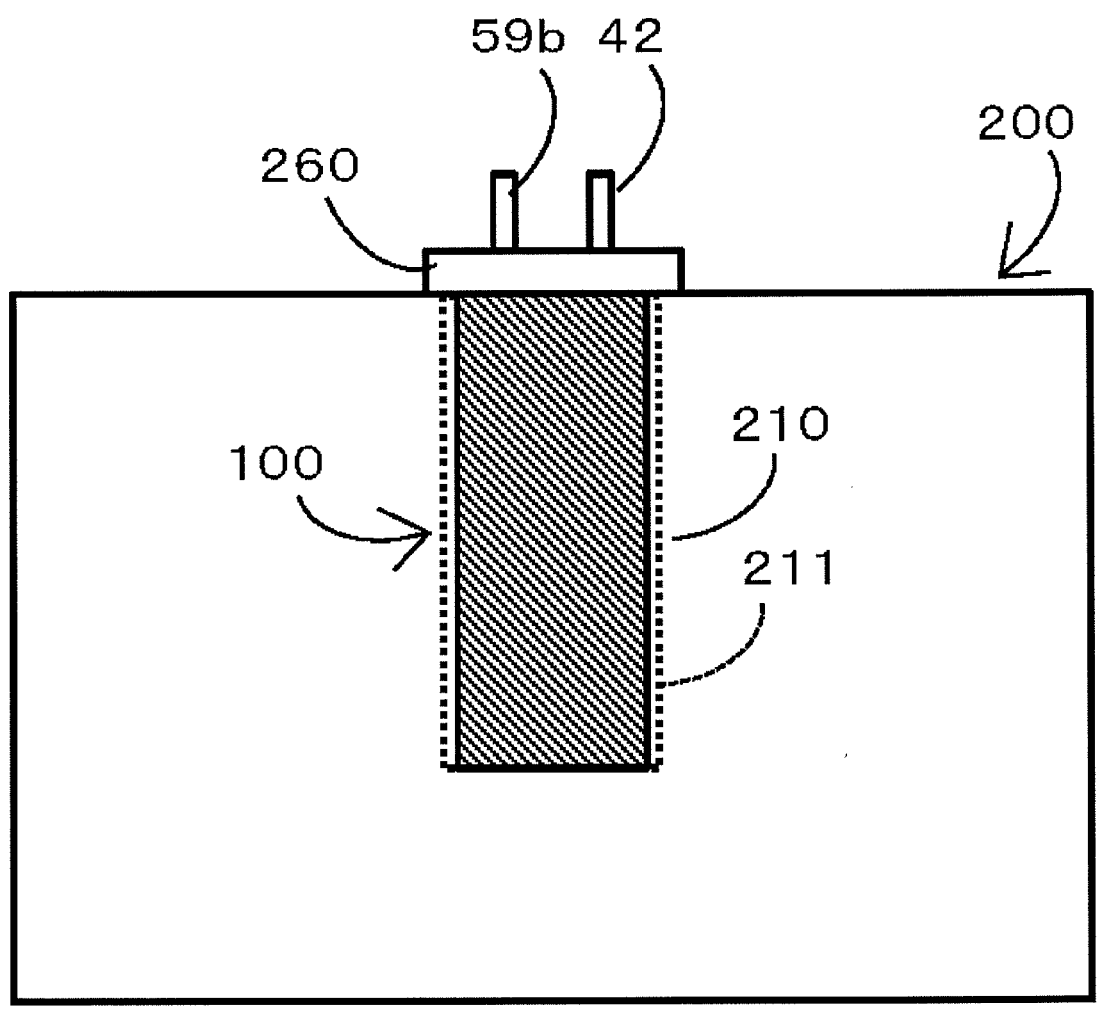
FIG. 8 is a sectional side view of an electronic instrument according to a second embodiment of the present invention.

As illustrated in FIG. 8, the second embodiment relates to an electronic instrument including the semiconductor module 100 described in the first embodiment, and a heat sink 200 having a recess 210 into which the semiconductor module 100 is inserted. The size of the recess 210 is designed so as to conform to the size of the semiconductor module 100. Accordingly, by inserting the semiconductor module 100 into the recess 210, it is possible to fix the semiconductor module 100 onto the heat sink 200.

Other configurations in the second embodiment are presented as substantially the same aspects as in the first embodiment. In the second embodiment, the same portions as described in the first embodiment will be provided with a same sign and detailed description will be omitted.

It is allowable that lubricant such as silicon grease is applied to the recess 210 of the heat sink 200. Applying this type of lubricant facilitates insertion of the semiconductor module 100 into the recess 210 of the heat sink 200. Also by utilizing lubricant, it is possible to increase adhesion of the heat dissipation surface of the frame body 70 and the first heat dissipation plate 14 toward the inner surface of the recess 210, and thus, to enhance thermal conductivity from the semiconductor module 100 to the heat sink 200. Accordingly, it is possible to achieve higher thermal dissipation.

It is also allowable to configure such that the inner surface of the recess 210 of the heat sink 200 has a plurality of grooves 210 along an insertion direction of the semiconductor module 100 (up-down direction in FIG. 8). By providing the groove 210, even in a case where the semiconductor module 100 is inserted after lubricant is put inside the recess 210, it is possible to allow the lubricant to move upwardly, with capillary phenomenon, in an insertion direction of the semiconductor module 100.

It is allowable to provide a closing section 260 configured to cover the semiconductor module 100 inserted into the recess 210 of the heat sink 200. It is allowable to configure such that the closing section 260 is formed of a lid member or that partial thermal-spraying of ceramic is applied to form a lid. By covering the semiconductor module 100 inserted into the recess 210 of the heat sink 200 with the closing section 260, it is possible to completely cover the semiconductor module 100. With this configuration, even in a case where the semiconductor module 100 generates heat, it is possible to prevent transmission of the heat to the outside of the heat sink 200 and the closing section 260.

Modification

Next, modification of the present invention will be described.

In the first embodiment, two electronic elements, namely, the first electronic element 13 and the second electronic element 23 are used in the aspect. Alternatively, the number of applicable electronic elements is optional and may be three or more. For example, it is allowable to use four electronic elements or six electronic elements. In addition, when three or more electronic elements are used, all the electronic elements may be arranged inside the frame body 70.

Figure 9:
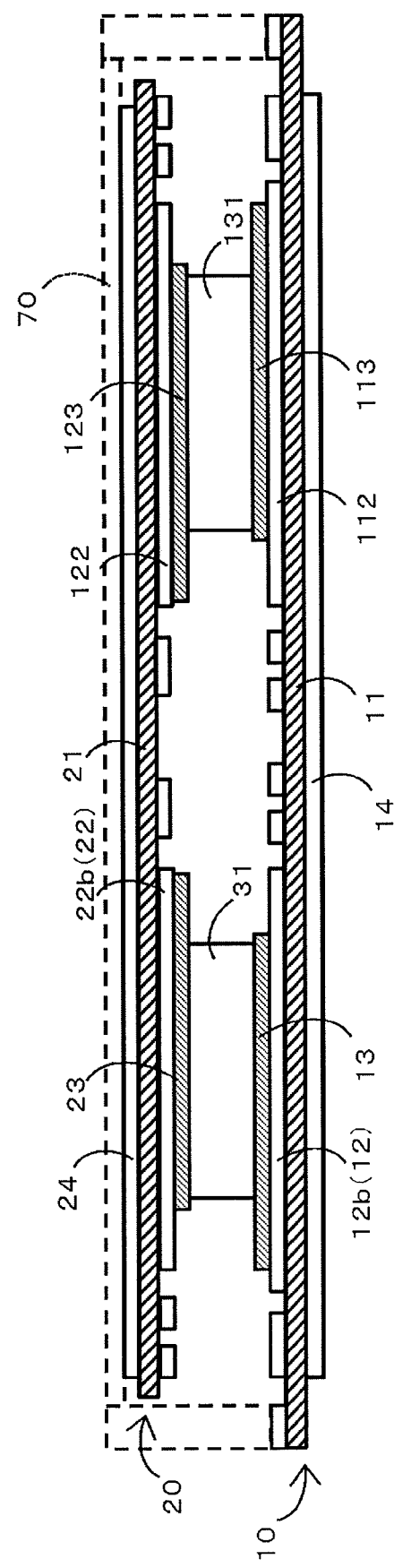
FIG. 9 is a sectional rear view of a semiconductor module according to a modification of the present invention.

In a case where four electronic elements are used, as illustrated in FIG. 9, it is allowable to configure such that a third electronic element 113 is provided on the first insulating substrate 11 via a third conductor layer 112, and that a fourth electronic element 123 is provided on the second insulating substrate 21 via a fourth conductor layer 122. As illustrated in FIG. 9, the third electronic element 113 and the fourth electronic element 123 may be connected with each other via a conductive column 131. Note that FIG. 9 is a rearview in which lead frames and connecting units, or the like, are omitted.

Figure 10:
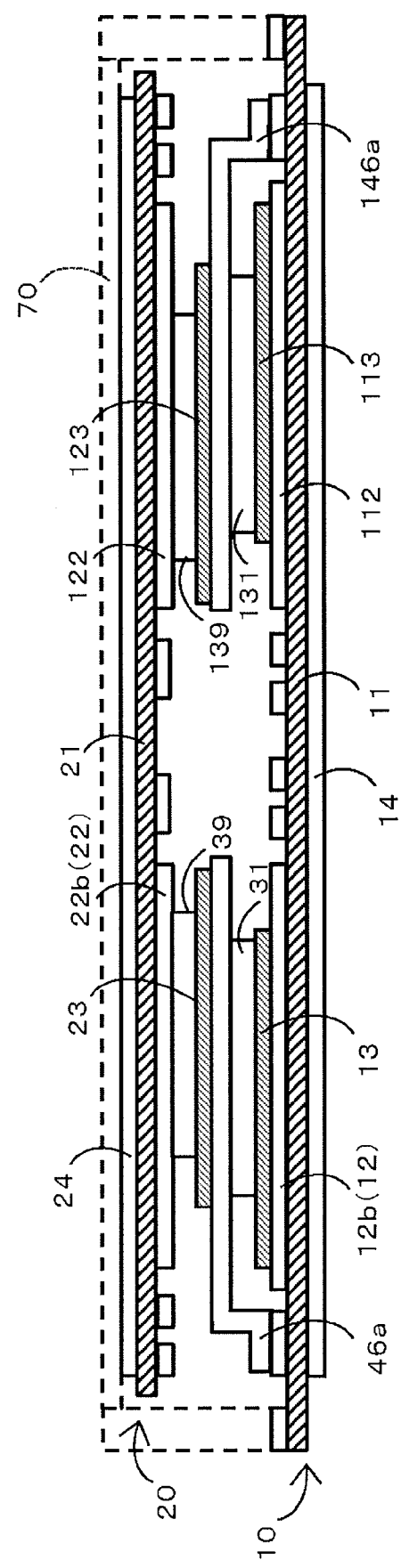
FIG. 10 is a sectional rear view of a semiconductor module according to another modification of the present invention.

It is allowable to employ an aspect illustrated in FIG. 10. In the aspect illustrated in FIG. 10, the second electronic element 23 is provided for the first electronic element 13 via the conductive column 31 and a connector 46a, and the fourth electronic element 123 is provided for the third electronic element 113 via the conductive column 131 and a connector 146a. In the aspect illustrated in FIG. 10, a conductive column 39 is provided between the second electronic element 23 and the second conductor layer portion 22b, while a conductive column 139 is provided between the fourth electronic element 123 and the fourth conductor layer 122. The connector 46a extends in a horizontal direction and is provided so as to cover the overall conductive column 31 when viewed from above. The second electronic element 23 is provided on a portion of an upper surface of the connector 46a. Similarly, the connector 146a extends in a horizontal direction and is provided so as to cover the overall conductive column 131 when viewed from above. The second electronic element 123 is provided on a portion of an upper surface of the connector 146a. Each of the conductive columns 31 and 131 need not have a complete columnar shape but may have a notch or may be hollow.

Figure 11:
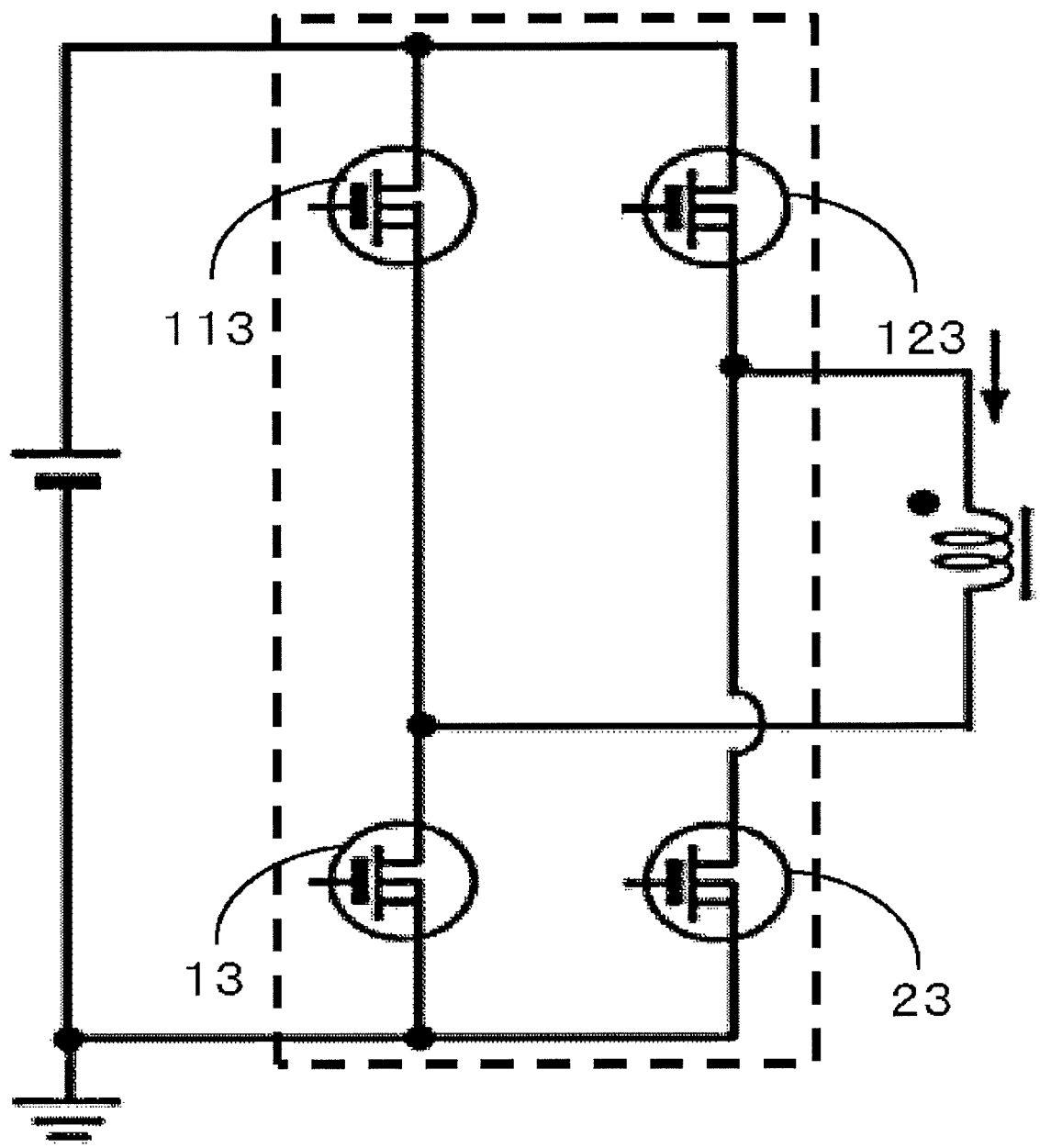
FIG. 11 is a circuit diagram for a case where four devices are used in the modification of the present invention.

An exemplary circuit diagram when four devices are used as illustrated in FIGS. 9 and 10 would be as illustrated in FIG. 11. The portion enclosed in a dotted line in FIG. 11 corresponds to the semiconductor module in the present embodiment.

As illustrated in FIGS. 9 and 10, the frame body 70 covers the electronic elements 13, 23, 113, 123 and the conductor layers 12, 22, 112, 123. The sealing resin 80 fills the inside of the frame body 70. Although not illustrated in FIGS. 9 and 10, it is allowable to provide the outer resin 90 so as to cover the overall side surface of the frame body 70 or to cover an overall outer peripheral surface of the frame body 70.

Figure 12:
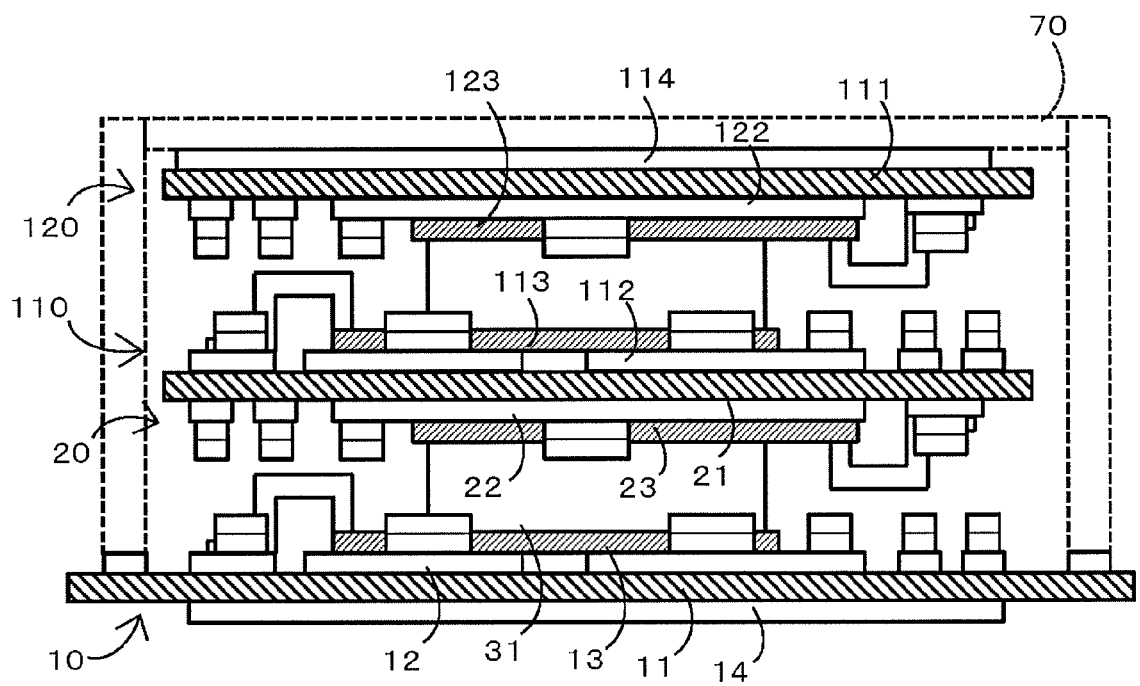
FIG. 12 is a sectional front view of a semiconductor module according to still another modification of the present invention.

Alternatively, it is allowable to configure such that three or more devices are stacked. An exemplary case in which four devices are stacked will be described. In this case, as illustrated in FIG. 12, it is allowable to configure such that the first electronic element 13 and the second electronic element 23 are shifted with each other in a direction with a 180-degree difference (shift in a left-right direction in FIG. 12), the third electronic element 113 and the fourth electronic element 123 are shifted with each other in a direction with a 180-degree difference (shift in the left-right direction in FIG. 12), while the first electronic element 13 and the third electronic element 113 are not shifted with each other, and there are neither second electronic element 23 nor the fourth electronic element 123. In an aspect illustrated in FIG. 12, the fourth conductor layer 122 is provided on a lower surface of a third insulating substrate 111, and the third conductor layer 112 is provided on an upper surface of the second insulating substrate 21. Arrangement, in the horizontal direction, of a third member 110 including the third conductor layer 112 and the third electronic element 113 is either completely the same as or similar to the arrangement of the first member 10. Arrangement, in the horizontal direction, of a fourth member 120 including the fourth conductor layer 122 and the fourth electronic element 123 is either completely the same as or similar to the arrangement of the second member 20.

Furthermore, unlike the aspect illustrated in FIG. 12, it is allowable to configure such that arrangement, in the horizontal direction, of the members (the third conductor layer 112, the third electronic element 113, or the like) included in the third member 110 has a 90-degree difference clockwise viewed from above, compared with the arrangement, in the horizontal direction, of the members (the first conductor layer 12, the first electronic element 13, or the like) included in the first member 10, and to configure such that arrangement, in the horizontal direction, of the members (the fourth conductor layer 122, the fourth electronic element 123, or the like) included in the fourth member 120 has a 270-degree difference clockwise viewed from above, compared with the arrangement, in the horizontal direction, of the members (the first conductor layer 12, the first electronic element 13, or the like) included in the first member 10.

Furthermore, it is allowable to configure such that arrangement, in the horizontal direction, of the members (the third conductor layer 112, the third electronic element 113, or the like) included in the third member 110 has a 270-degree difference clockwise viewed from above, compared with the arrangement, in the horizontal direction, of the members (the first conductor layer 12, the first electronic element 13, or the like) included in the first member 10, and to configure such that arrangement, in the horizontal direction, of the members (the fourth conductor layer 122, the fourth electronic element 123, or the like) included in the fourth member 120 has a 90-degree difference clockwise viewed from above, compared with the arrangement, in the horizontal direction, of the members (the first conductor layer 12, the first electronic element 13, or the like) included in the first member 10.

Even in a case where four devices are stacked in this manner, the circuit diagram, as an example, may be formed as illustrated in FIG. 11.

Even in a case where four devices are stacked in this manner, the frame body 70 covers the electronic elements 13, 23, 113, and 123 and the conductor layers 12, 22, 112, and 123. The sealing resin 80 fills the inside of the frame body 70. Although not illustrated in FIG. 12, it is allowable to provide the outer resin 90 so as to cover the overall side surface of the frame body 70 or to cover an overall outer peripheral surface of the frame body 70.

Figure 13:
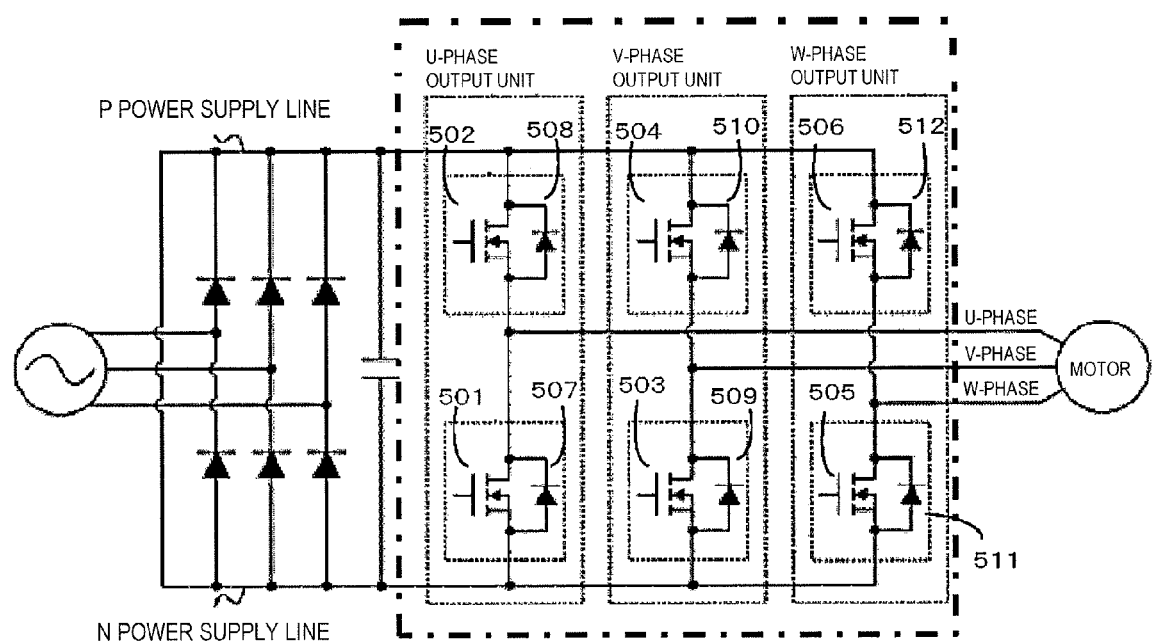
FIG. 13 is a circuit diagram for case where six devices are used in the modification of the present invention.

Alternatively, it is allowable to configure such that still more devices are covered with the frame body 70. For example, it is allowable to configure such that electronic elements 501 to 512 in a circuit as illustrated in FIG. 13 are covered with the frame body 70. The electronic elements 501 to 512 enclosed with a one-dot chain line illustrated in FIG. 13 correspond to the portions that are covered with the frame body. Reference numbers 501 to 506 are exemplary switch elements. Reference numbers 507 to 512 are exemplary rectifying elements. In an aspect as illustrated in FIG. 13, it is allowable to configure such that a switch element 501 and a rectifying element 507 are arranged to face each other and connected to each other via a conductive column, a switch element 502 and a rectifying element 508 are arranged to face each other and connected to each other via a conductive column, a switch element 503 and a rectifying element 509 are arranged to face each other and connected to each other via a conductive column, a switch element 504 and a rectifying element 510 are arranged to face each other and connected to each other via a conductive column, a switch element 505 and a rectifying element 511 are arranged to face each other and connected to each other via a conductive column, and a switch element 506 and a rectifying element 512 are arranged to face each other and connected to each other via a conductive column.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST 10 first member
11 first insulating substrate
12 first conductor layer
13 first electronic element
20 second member
21 second insulating substrate
22 second conductor layer
23 second electronic element
31 conductive column
46 first connecting unit
47 column connecting unit
70 frame body
80 sealing resin
90 outer resin
100 semiconductor module
200 heat sink
210 recess
260 closing section

What is claimed is:

1. A semiconductor module comprising:
a first insulating substrate;
a first conductor layer provided on a mounting surface of the first insulating substrate;
a first electronic element provided on the first conductor layer;
a second insulating substrate;
a second conductor layer provided on a mounting surface of the second insulating substrate; and
a second electronic element provided on the second conductor layer;
a sealing resin, which covers an overall mounting region within the mounting surface of the first insulating substrate, the first conductor layer, the first electronic element, the second electronic element, the second conductor layer and an overall mounting region within the mounting surface of the second insulating substrate; and
a frame body, which is made of metal and covers the overall sealing resin;
wherein the first conductor layer, the first electronic element, the second electronic element and the second conductor layer are arranged in an order between the first insulating substrate and the second insulating substrate;
wherein a conductive column is placed between an upper surface of the first electronic element and a lower surface of the second electronic element, and the conductive column connects the upper surface of the first electronic element with the lower surface of the second electronic element;
wherein the first electronic element and the second electronic element are switching devices; and
wherein the conductive column is connected to a source electrode.

2. The semiconductor module, according to claim 1, further comprising:
an outer resin, which is provided outside of the frame body,
wherein an attaching conductor layer does not protrude outside of the outer resin.

3. The semiconductor module according to claim 1, further comprising:
an outer resin, which is provided outside of the frame body and is made of a material with flame retardance compared with the sealing resin.

4. An electronic instrument comprising:
the semiconductor module, according to claim 1; and
a heat sink having a recess, into which the semiconductor module is inserted.

5. The electronic instrument, according to claim 4, wherein lubricant is applied between the recess of the heat sink and the semiconductor module.

6. The electronic instrument, according to claim 4, further comprising:
a closing section, which covers the semiconductor module inserted into the recess of the heat sink.

7. A method for manufacturing a semiconductor module comprising:
preparing a first insulating substrate, a first conductor layer provided on a mounting surface of the first insulating substrate and a first electronic element provided on the first conductor layer, a second insulating substrate, a second conductor layer provided on a mounting surface of the second insulating substrate and a second electronic element provided on the second conductor layer;
arranging the first conductor layer, the first electronic element, the second electronic element and the second conductor layer in an order between the first insulating substrate and the second insulating substrate;
connecting the first electronic element with the second electronic element by placing a conductive column between an upper surface of the first electronic element and a lower surface of the second electronic element;

covering the overall mounting region of the first insulating substrate, the first conductor layer, the first electronic element, the conductive column, the second electronic element, the second conductor layer and the overall mounting region of the second insulating substrate, with a frame body made of metal; and injecting a sealing resin material into the frame body, as a result, the overall mounting region of the first insulating substrate, the first conductor layer, the first electronic element, the conductive column, the second electronic element, the second conductor layer and the overall mounting region of the second insulating substrate are covered by a sealing resin;

wherein the first electronic element and the second electronic element are switching devices, and wherein the conductive column is connected to a source electrode.

8. A method for manufacturing a semiconductor module comprising:

covering, among a first insulating substrate, a first conductor layer provided on a mounting surface of the first insulating substrate and a first electronic element provided on the first conductor layer, an overall mounting region within the mounting surface, the first conductor layer and the first electronic element with a frame body made of metal;

injecting a sealing resin material into the frame body, as a result, the overall mounting region, the first conductor layer and the first electronic element are covered by a sealing resin;

setting the frame body inside a metal mold, before injecting the sealing resin material into the frame body;

removing a part of the metal mold, after injecting the sealing resin material into the frame body; and injecting an outer resin material into the metal mold after removing the part of the metal mold, as a result, an outer resin, which is made of a material with flame retardance compared with the sealing resin, is provided outside of the frame body.

\* \* \* \* \*